(12) United States Patent
Frankowsky et al.

(10) Patent No.: US 6,727,586 B2
(45) Date of Patent: Apr. 27, 2004

(54) SEMICONDUCTOR COMPONENT

(75) Inventors: Gerd Frankowsky, Höhenkirchen-Siegertsbrunn (DE); Thorsten Meyer, Erlangen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/301,368

(22) Filed: Nov. 21, 2002

(65) Prior Publication Data
US 2003/0094701 A1 May 22, 2003

(30) Foreign Application Priority Data
Nov. 21, 2001 (DE) .......................... 101 57 008

(51) Int. Cl.[7] .................. H01L 23/48; H01L 23/52; H01L 29/40
(52) U.S. Cl. .................. 257/737; 257/738; 257/778
(58) Field of Search ............... 257/737, 738, 257/778; 438/108, 613

(56) References Cited

U.S. PATENT DOCUMENTS

| 4,764,804 A | * | 8/1988 | Sahara et al. ............... 257/717 |
| 5,431,328 A | * | 7/1995 | Chang et al. .......... 228/180.22 |
| 5,877,556 A | | 3/1999 | Jeng et al. |
| 6,228,684 B1 | | 5/2001 | Maruyama |
| 6,388,322 B1 | * | 5/2002 | Goossen et al. ............. 257/737 |

FOREIGN PATENT DOCUMENTS

JP    2001 007 275 A    1/2001

* cited by examiner

Primary Examiner—Phat X. Cao
Assistant Examiner—Theresa T. Doan
(74) Attorney, Agent, or Firm—Laurence A. Greenberg; Werner H. Stemer; Ralph E. Locher

(57) ABSTRACT

A semiconductor component that is suitable for wafer level packaging contains a plurality of contact elements that are elevated relative to a main body of the semiconductor component. Some of the contact elements are needed only for purposes of testing on the wafer level and should not be subsequently accessible from outside. For this purpose, the semiconductor component contains an insulating layer that covers the elevated contact elements that are provided for testing purposes but leaves the remaining contact elements uncovered. In this way, inadvertent activating of test functions on the chip is effectively prevented by simple measures, for instance by inserting only one additional fabrication step.

8 Claims, 3 Drawing Sheets

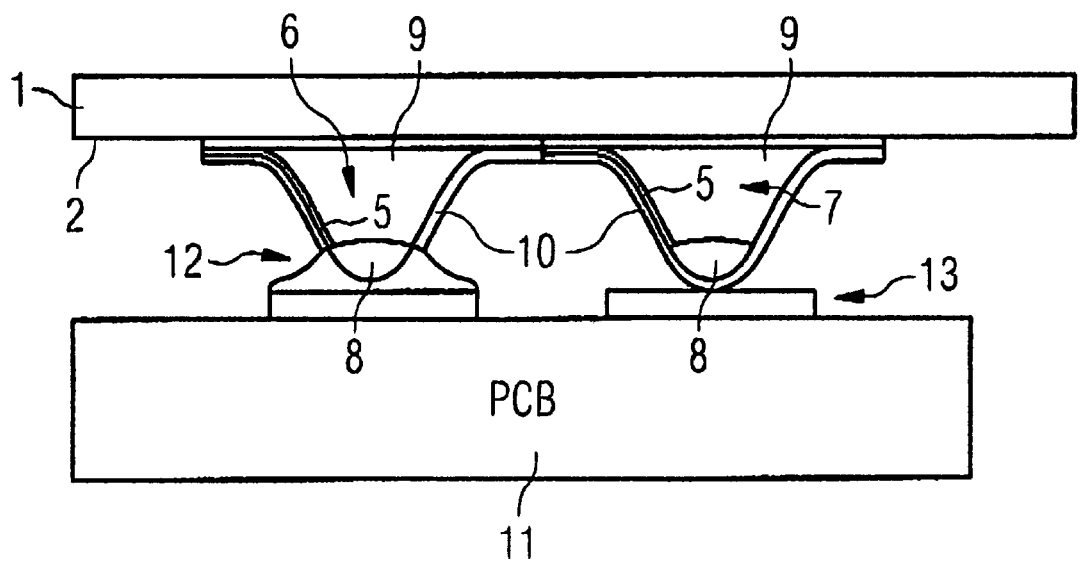

SEMICONDUCTOR COMPONENT

BACKGROUND OF THE INVENTION

Field of the Invention

In chip fabrication a plurality of integrated circuits are typically produced on one wafer and separated (singled) in a later step. A semiconductor disk that is produced and to be singled is referred to as a die.

The functionality of the semiconductor circuits that are integrated on the individual dies is usually checked prior to further processing (packaging) owing to the numerous parameters that fluctuate in semiconductor fabrication, which can influence component tolerances and so on, and owing to other stochastic influences. Only the semiconductor dies that correspond to the specified requirements are surrounded with a housing, for instance in TSOP or micro-PGA form. Only the pads on the semiconductor die that are intended to be available in normal operation are connected through to the outside, for instance by spider contacting. In contrast, the pads that are only needed for the above-mentioned testing steps are not connected through to the outside and are consequently protected against unintended contacting.

In modern packaging methods such as wafer level packaging (WLP), it is problematic that the pads on the semiconductor die that are needed for testing must be available for testing on the wafer level, that is to say prior to the singling of the silicon wafers, because the packaging still has to take place on the wafer level before the testing. In such methods, the packaging is first handled by attaching rewiring planes and connecting legs, for instance in the form of solder balls, on the silicon wafer, and then the functionality is tested on the wafer level. Accordingly, the terminal contacts that are needed for testing must be led to the outside and are thus exposed, without protection, to the risk of an unintended contacting even after the semiconductor dies are singled.

It is desirable to deactivate the terminal contacts that are led to the outside and provided only for testing, in order to prevent an unwanted activation of test functions or test routines of the integrated circuits on the semiconductor die.

SUMMARY OF THE INVENTION

It is accordingly an object of the invention to provide a semiconductor component that overcomes the above-mentioned disadvantages of the prior art devices of this general type.

With the foregoing and other objects in view there is provided, in accordance with the invention, a semiconductor component. The semiconductor component contains a main body having a surface and a plurality of pads including operating pads and test pads for connecting to electronic components integrated in the semiconductor component. A plurality of contact elements for conductively contacting the semiconductor component, the contact elements are disposed on the main body and are elevated relative to the surface resulting in elevated contact elements. Each of the elevated contact elements is allocated to one of the pads. A rewiring plane having a plurality of tracks conductively connects the pads to the contact elements that are elevated relative to the main body. An insulating layer is applied on the main side and covers the elevated contact elements allocated to the test pads while leaving the elevated contact elements allocated to the operating pads uncovered.

The terms semiconductor component and semiconductor die are hereinafter used synonymously.

The vertical contact elements are inventively characterized by being raised relative to the main side of the semiconductor die; that is, they extend orthogonally relative to the main side. As a result, when the semiconductor die is placed on a module or printed circuit board (PCB), only the raised contact elements touch the module or PCB, and conductive and/or mechanical contact can be produced.

All that is required for the fabrication of the semiconductor die that corresponds to the inventive principle is to insert an additional step, namely the application of an insulating layer on the main side of the semiconductor die. Care must be taken that the pads that are needed for test modes or test functions only are covered by the insulating layer and consequently protected against unintended contacting. On the other hand, the pads that are needed for normal operation of the semiconductor die are left uncovered.

The invention thus combines the advantages of wafer level packaging, namely cost savings, time savings, etc., which are particularly beneficial in mass production techniques, with the additional ability to protect the test pads at the semiconductor die against unwanted and unintended contacting after the testing on the wafer level and prior to further processing. The semiconductor die may be further processed by installation, e.g. soldering, onto a PCB.

The testing of specific functions of the circuits that are integrated on the semiconductor die on the wafer level can inventively occur even before the dies are singled but after the packaging step. The above described test pads can serve for charging the circuit that is integrated on the semiconductor die with specified signals, activating specified test functions, or making it possible to read test signals from the chip.

The insulating layer can be applied for a particularly small extra outlay with the aid of a solder stop mask.

In order to apply the insulating layer, a printing or plasma coating technique can be used. The insulating layer serves for electrically isolating the test pads, so that they can no longer be contacted externally. The material utilized for producing the insulating layer can be based on an epoxy, silicon, or other nonconductive compound.

In a preferred embodiment of the present invention, the vertical contact elements are bump-shaped.

The vertical contact elements can be constructed as bump-shaped elevations. The vertical contact elements can be constructed as solder balls.

According to another preferred embodiment of the invention, the vertical contact elements are disposed on the main side of the semiconductor die in a matrix configuration. One of the advantages of the matrix configuration of the vertical contact elements is that the grid (pitch) formed by the contacts can be relatively rough, while a relatively large number of vertical contact elements can be attached relative to the overall surface area of the semiconductor die. Furthermore, when placed on a PCB, the semiconductor die occupies only the chip area that it would occupy anyway.

In another preferred embodiment of the invention, the semiconductor die is constructed as a flip chip. In flip chip fabrication, the semiconductor dies are placed on a module or PCB face down. The installation can occur in a soldering process, for instance in a reflow soldering process.

In another preferred embodiment of the invention, the insulating layer is constructed as a solder stop layer. Applying such an insulating layer allows the inventive semiconductor dies to be produced for a particularly small added outlay specifically when the semiconductor die is to be further processed by reflow soldering.

In an additional preferred embodiment of the invention, the insulating layer is applied to the semiconductor die by serigraphy.

In an additional preferred embodiment of the invention, the insulating layer is a layer based on an epoxy material.

In another preferred embodiment of the invention, the insulating layer is realized as a silicon compound.

Other features which are considered as characteristic for the invention are set forth in the appended claims.

Although the invention is illustrated and described herein as embodied in a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6 is a cross-sectional view of the semiconductor die according to FIG. 3A soldered onto a PCB.

DESCRIPTION OF THE PREFERRED EMBODIMENTS

Figure 1A:
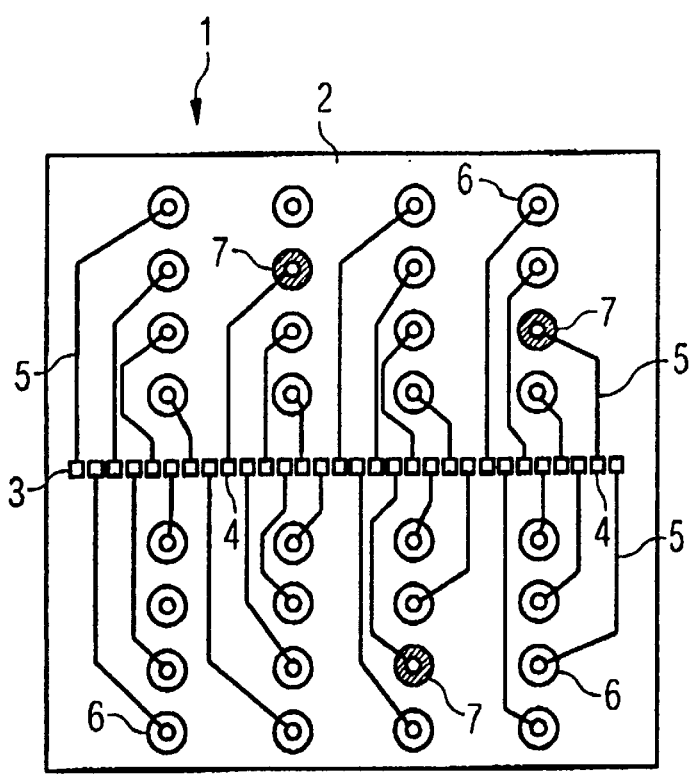
FIG. 1A is a diagrammatic, plan view of a semiconductor die with vertical contact elements according to the invention.

Referring now to the figures of the drawing in detail and first, particularly, to FIG. 1A thereof, there is shown a semiconductor die 1 in a plan view of its active face, i.e. the side including integrated electronic elements and their wirings.

The electronic elements and circuits that are integrated on the semiconductor die 1 are connected through to the die face with the aid of a plurality of bond pads disposed in a series. The bond pads include pads 3 for normal operation of the electronic circuits on the semiconductor die, and test pads 4 for activating or executing test modes of the integrated circuits.

On a top-side 2 of the semiconductor die 1 is a rewiring plane with a plurality of tracks 5 which connect the bond pads 3, 4 to vertical contact elements 6, 7 that are also disposed on the face 2 of the semiconductor die 1.

The vertical contact elements 6, 7 are constructed as bump-shaped elevations which are evenly distributed on the face 2 of the semiconductor die 1 and which are configured in a matrix, i.e. at intersections of mutually orthogonal rows and columns.

The vertical contact elements on the face 2 include contacts for normal operation 6 and test operations 7. The tracks 5 of the rewiring plane conductively connect the pads 3 which are provided for normal chip operation to the respectively allocated vertical contact elements 6 which are also provided for normal operation. The tracks 5 also connect the test pads 4 to respectively allocated vertical contact elements 7.

Figure 1B:
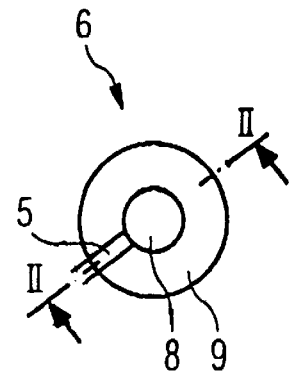
FIG. 1B is an enlarged, plan view of a vertical contact element.

FIG. 1B represents an enlarged section of one of the vertical contact elements 6 that is provided for normal operation with the actual contact region 8 which is installed on a bump-shaped elevation 9 and which is connected to the allocated bond pad 3 via the track 5.

Figure 2:
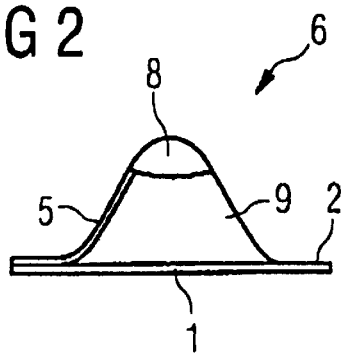
FIG. 2 is a cross-sectional view through one of the vertical contact elements shown in FIG. 1.

FIG. 2 represents a cross-section through the enlarged section of the vertical contact element 6 of FIG. 1B with the bump-shaped elevation 9 that is disposed on the face 2 of the semiconductor die 1. The actual contact region 8 covers a portion of the bump-shaped elevation 9, namely the top portion, like a cap and is conductively connected to the track 5 which is allocated to the contact element 6.

Accordingly, FIGS. 1A, 1B and the cross-section according to FIG. 2 represent a view, after the singling step, of the semiconductor die that is fabricated according to a wafer level packaging technique. Any tests that are to be carried out are carried out after the packaging and before the singling, with the aid of the vertical contact elements 7 that are provided for testing.

The advantage of testing on the wafer level prior to singling is that both time savings and cost savings are achieved compared to a single-component test. The test contacts 4, 7 are provided for triggering or activating specific test functions during production. Because the tests in wafer level packaging are performed only after the packaging, the contact elements 7 that are provided for testing must be accessible from the outside and are therefore constructed as the vertical contact elements 7.

Figure 3A:
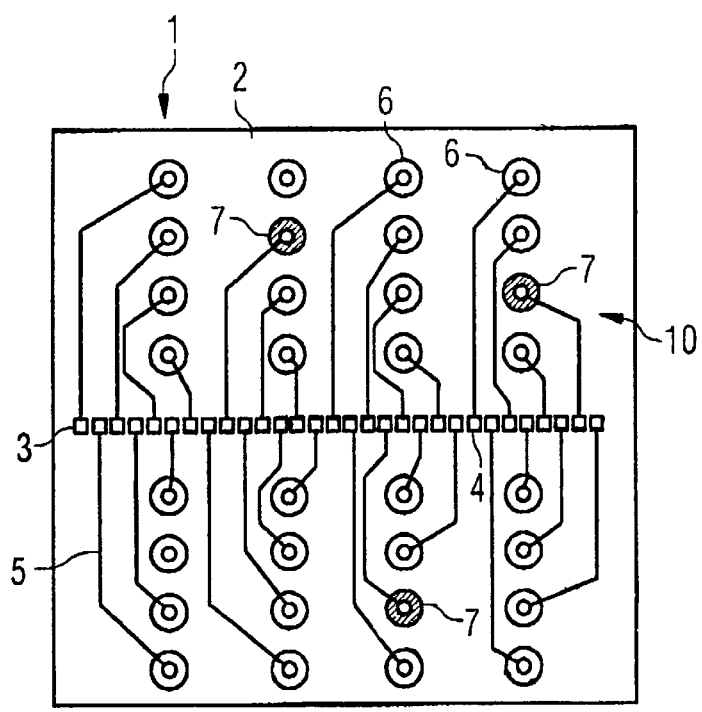
FIG. 3A is a plan view of the semiconductor die according to FIG. 1, but partly covered with an insulating layer.

FIG. 3A represents a further development of the subject matter of FIG. 1A according to the proposed principle. Here, an insulating layer 10 is deposited on the face 2 of the semiconductor die 1, which covers the conductive portions 5, 8 of the vertical contact elements 7 that are provided for testing only, thereby isolating them from the outside. In the subject matter of FIG. 3A, it is no longer possible to inadvertently contact the vertical contact elements 7 that are provided for testing the circuits on the chip 1. But the contact regions 8 of the vertical contact elements 6 that are provided for normal operation are of course not covered by the insulating layer 10, so that the correct functionality of the semiconductor die 1 in normal operation is guaranteed.

Figure 3B:
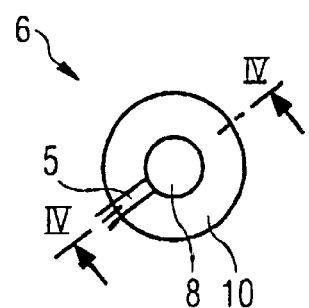
FIG. 3B is an enlarged plan view of an uncovered vertical contact element.

As in FIG. 1A, FIG. 3B shows one of the vertical contact elements 6 which is configured for normal operation. In FIG. 3B, the contact region 8 in the vertical contact element 6 is not covered by the insulating layer 10; rather, it is freely accessible and conductively contactable. In contrast, FIG. 3C shows the vertical contact element 7 for testing which has the bump-shaped elevation 9 which is covered with the insulating layer 10.

Figure 4:
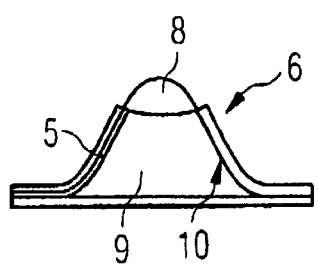
FIG. 4 is a cross-sectional view through the vertical contact element for normal operation according to FIG. 3C.

FIG. 4 represents a cross-section through the vertical contact element 6 with the insulating layer 10. Here it can be clearly seen how the insulating layer 10 covers the bump-shaped elevation 9 including the track for the rewiring 5 of the vertical contact element 6 but does not cover the actual contact region 8.

Figure 3C:
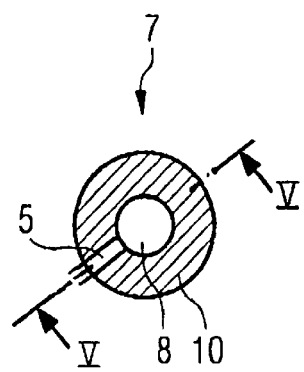
FIG. 3C is an enlarged plan view of a covered vertical contact element.

FIG. 3C also represents an enlargement of the vertical contact element 7 which is provided for a test functionality, whereby the bump-shaped elevation 9 is again covered by the insulating layer 10, but here the contact region 8 is also covered.

Figure 5:
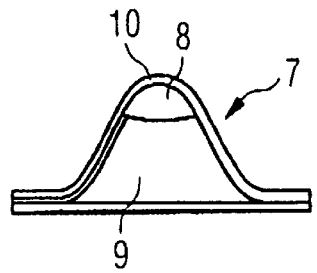
FIG. 5 is a cross-sectional view through the contact element according to FIG. 3B that is provided for activating test functions.

This can be clearly seen with the aid of the cross-section through the vertical contact element 7 represented in FIG. 5. The insulating layer 10 completely covers the vertical contact element 7 including the contact region 8 and the connected track 5.

The coating of the insulating layer 10 as represented in FIG. 3A occurs after the testing of the component and prior to assembly, for instance on a PCB. Only the contact regions or pads 8 of the vertical contact elements 6 which are provided for normal operation are kept clear. The test contact elements 7 are completely covered with the isolating material 10. The insulating layer 10 guarantees that the test contact elements 7 and thus the test pads 4 are no longer electrically accessible from the outside after the packaging and the testing. The achieved deactivation of the test pads 4, 7 guarantees that a later activating of test functions or test routines can no longer occur. The insulating layer 10 is constructed as a layer formed from an epoxy or silicon compound. Masking techniques can be applied for the application of the insulating layer 10. Because the vertical contact elements according to FIGS. 1A and 3A are configured at a relatively rough pitch, corresponding processing steps can be carried out inexpensively.

In alternative embodiments of the insulating layer 10 on the semiconductor die 1 according to FIGS. 3A to 5, the insulating layer 10 can also cover only the vertical contact elements 7 that are provided for testing, and also only the contact regions 8 there.

Lastly, FIG. 6 represents a cross-section of a section of the semiconductor die 1 according to FIG. 3A, which is already soldered to a printed circuit board 11. For purposes of simplifying the present principle, only one vertical contact element 6 that is provided for normal operation and one vertical contact element 7 that is provided for testing operation are represented. Both are attached to the face 2 of the semiconductor die 1 as described in connection with FIGS. 1A and 3A. The rewiring plane with the tracks 5 is also provided but is not represented in FIG. 6.

As already explained in connection with the cross-sections according to FIGS. 4 and 5, the contact element 6 for normal operation contains the insulating layer 10 covering the bump-shaped elevation 9 but not the contact region 8. On the other hand, in the contact element 7 for testing, the insulating layer 10 covers both the bump-shaped elevation 9 and the contact region or pad 8 of the bump-shaped elevation 9. Accordingly, it is only possible to connect the normal-operation contact element 6 to a solder pad 13 that is allocated to it on a PCB by a solder joint 12, thereby permanently conductively connecting them, whereas the contact region 8 of the test contact element 7 would not be conductively contactable even in the presence of a soldering quantity on the allocated solder pad 13, but rather a mechanical connection forms. The successful production of a conductive solder connection 12 is thus inventively independent of the presence of a solder paste on the PCB 11. The solder joint 12 can be formed in a reflow solder process, for instance. The inadvertent contacting of a vertical contact element 7 of a subject matter according to FIG. 3A with the described insulating layer 10—which is provided for testing only—is thus reliably prevented.

We claim:

1. A semiconductor component, comprising:
    a main body having a surface and a plurality of pads including operating pads and test pads for connecting to electronic components integrated in the semiconductor component;
    a plurality of contact elements for conductively contacting the semiconductor component, said contact elements disposed on said main body and elevated relative to said surface resulting in elevated contact elements, each of said elevated contact elements being allocated to one of said pads;
    a rewiring plane having a plurality of tracks conductively connecting said pads to said contact elements that are elevated relative to said main body; and
    an insulating layer applied on said main side and covering said elevated contact elements allocated to said test pads while leaving said elevated contact elements allocated to said operating pads uncovered.

2. The semiconductor component according to claim 1, wherein said elevated contact elements are bump-shaped.

3. The semiconductor component according to claim 1, wherein said elevated contact elements are disposed on said main body in a matrix configuration.

4. The semiconductor component according to claim 1, wherein the semiconductor component is as a flip chip.

5. The semiconductor component according to claim 1, wherein said insulating layer is a solder stop layer.

6. The semiconductor component according to claim 1, wherein said insulating layer is applied to said main body using a serigraphy process.

7. The semiconductor component according to claim 1, wherein said insulating layer is a layer based on an epoxy material.

8. The semiconductor component according to claim 1, wherein said insulating layer is formed from a silicon compound.

* * * * *